United States Patent [19]

Fujine et al.

[11] 4,131,911
[45] Dec. 26, 1978

[54] HERMETICALLY SEALED OPTO-ELECTRICAL SEMICONDUCTOR DEVICE

[75] Inventors: Nobuhiko Fujine; Masato Nakajima, both of Tokyo, Japan

[73] Assignee: Nippon Electric Company, Ltd., Tokyo, Japan

[21] Appl. No.: 732,138

[22] Filed: Oct. 13, 1976

[30] Foreign Application Priority Data

Oct. 15, 1975 [JP] Japan .................................. 50-123905

[51] Int. Cl.² ............................................. H01L 23/02
[52] U.S. Cl. .................................. 357/74; 331/94.5 P;
357/17; 357/18; 357/30; 357/81
[58] Field of Search ................... 357/17, 18, 74, 81,
357/30; 331/94.5 H, 94.5 P, 94.5 D; 174/52 S,
52 H; 220/2.3 R

[56] References Cited

U.S. PATENT DOCUMENTS

| | | | |
|---|---|---|---|
| 2,584,717 | 2/1952 | Alpert et al. | 220/2.3 R |
| 3,396,344 | 8/1968 | Broom | 357/18 |
| 3,445,786 | 5/1969 | Snyder et al. | 331/94.5 |
| 3,705,255 | 12/1972 | Low et al. | 357/74 X |
| 3,840,889 | 10/1974 | O'Brien et al. | 357/81 |
| 4,003,074 | 1/1977 | Yonezu et al. | 357/74 |

OTHER PUBLICATIONS

J. L. Picque et al., "CW, Single-Mode, Tunable GaAs Lasar System with Good Frequency Stability", *Applied Physics*, vol. 6, No. 3, Apr. 1975, pp. 373–379.

Primary Examiner—Stanley D. Miller, Jr.
Assistant Examiner—James W. Davie
Attorney, Agent, or Firm—Hopgood, Calimafde, Kalil, Blaustein & Lieberman

[57] ABSTRACT

A hermetically sealed opto-electrical semiconductor device includes an opto-electrical semiconductor element centrally disposed in an envelope having at least two openings through which light beams are to pass, with flat plates made of a transparent material hermetically covering the respective openings perpendicularly to the directions of the light beams.

13 Claims, 7 Drawing Figures

HERMETICALLY SEALED OPTO-ELECTRICAL SEMICONDUCTOR DEVICE

BACKGROUND OF THE INVENTION

This invention relates to hermetically sealed opto-electrical semiconductor devices including an electricity-to-light converting semiconductor devices such as a laser diode, light-emitting diode and the like and a light-to-electricity converting semiconductor devices such as a light-receiving diode, a photo-sensitive semiconductor device and the like. More particularly, the present invention relates to a semiconductor device adapted to emit or receive light in two or more directions perpendicular to the axial direction of a mount on which a semiconductor element is mounted.

Semiconductor devices having an electricity-to-light converting function or a light-to-electricity converting function should have such a construction that a semiconductor element be protected from an ambient and yet the semiconductor element emit or receive light to or from the exterior. As a casing for use in an opto-electrical semiconductor device which permits the transmission of light to or from the exterior in two or more directions included in one plane, suggested is a structure comprising a transparent glass cylinder which houses a semiconductor element therein and has its opposite ends sealed with metallic electrodes, respectively. The external surface of this glass cylinder is locally ground or transformed into a flat surface at light-transmitting portions of the cylinder wall for the purpose of achieving desired light-passing characteristics. With an opto-electrical semiconductor device having such structure, there tends to occur a lack of flatness on its flattened surface portions of the glass cylinder, with the result that light passing therethrough is scattered or loses its linearity. This drawback is attributable to locally flattened surface of the glass cylinder. In addition, since the glass cylindrical body is hermetically sealed with metallic electrodes at the opposite ends of the body, another shortcoming occurs that joint of the metallic electrode to the cylinder lacks desired strength and provides poor air-tightness.

It is accordingly an object of the present invention to provide an opto-electrical semiconductor device with excellent optical characteristics, air-tightness and mechanical strength.

SUMMARY OF THE INVENTION

The hermetically sealed opto-electrical semiconductor device according to the present invention is characterized in that an envelope or casing of the device is provided with two or more openings at the portions through which light beams in two or more directions are to pass and that flat plates made of a transparent material are placed so as to sealingly cover the respective openings in respective positions perpendicular to the directions of the light beams to pass therethrough. A semiconductor element is disposed in a central position of the envelope on a mount, favorably on a metallic stud, so as to be adapted to emit or receive the light beams in at least two directions perpendicular to the axial direction of the mount through the openings. The envelope is mechanically coupled with the mount of the semiconductor element and hermetically sealed. According to the invention, use of flat plates of glass or other transparent material improves the light-passing performance, while mechanical strength and air-tightness of the sealed portions are increased by freely selecting such a suitable material for the envelope as being able to make firm and strong joint for hermetic seal.

The invention will now be described in greater detail in conjunction with the accompanying drawings wherein:

Description will now be given in more detail of the semiconductor device according to the present invention with reference to the suggested device. For the convenience of description, a laser diode is taken as an example of semiconductor devices of the type described.

Figure 1:
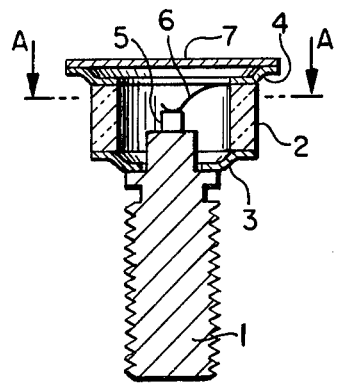
FIG. 1 is a cross-sectional view of a suggested electricity-to-light converting semiconductor device.

FIG. 1 is a sectional view showing a suggested semiconductor laser device, which includes a stud made of a metal such as copper that presents high thermal conductivity and a transparent, insulating cylinder 2 made of glass, quartz or the like hermetically secured by means of a supporting member 3 to a metal stud 1. The supporting member 3 is made of a metal having a coefficient of thermal expansion approximating that of the insulating cylinder 2. A sealing member 4 made of a metal having a coefficient of thermal expansion close to that of the insulating cylinder 2 is hermetically secured to the other end of the insulating cylinder 2 in such a manner as in the case of the supporting member 3. A semiconductor laser element 5 is mechanically fixed on the stud 1 by using solder or metal paste, whereby one electrode of the semiconductor laser element 5 is electrically connected to the metal stud. The other electrode is connected through a lead wire 6 to the sealing member 4. In addition, a metal cover is hermetically secured to the top surface of the sealing member 6. With the laser diode thus arranged, when a voltage is impressed across the stud 1 and the cover 7, laser beams are emitted from the semiconductor element 5 at least in the opposite two directions through the transparent insulating cylinder 2 to the exterior. In this respect, it is preferable that the light beams will not be diverge.

Figure 2A:
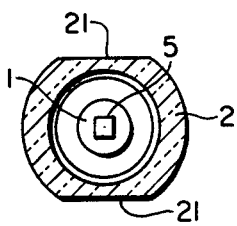
FIG. 2(a) is a cross-sectional view taken along the line A—A of FIG. 1.
Figure 2B:
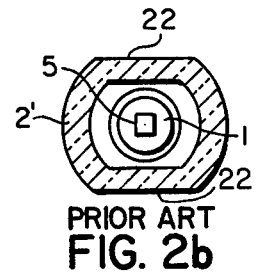
FIG. 2(b) is a cross-sectional views of a modified shape.

Referring to FIG. 2(a), the insulating cylinder 2 is provided with two flattened faces 21 formed by locally grinding the circular surface of the cylinder 2. In stead, as shown in FIG. 2(b), the insulating cylinder 2' may be provided with flattened portions 22 formed by thermally transforming the wall of the cylinder 2'. Those flattened faces 21 or 22 are directed perpendicularly to the advancing directions of light beams, thereby preventing the diverging of light. However, this structure suffers from a shortcomings that, because part of the surface of the insulating cylinder 2, 2' is formed into a flat face according to the grinding or thermal working process, the finishing of a surface to a high-precision parallelism and flatness is difficult. Moreover, a force to be applied to the device, upon attaching and releasing of the device, electrical connection or the like, is transmitted to the insulating cylinder 2, thus presenting possibility of causing damages on the cylinder 2 itself or on the sealing joints of the both ends of the cylinder 2 and the metallic members 3 and 4. For avoiding such damages, the wall thickness of the insulating cylinder 2 should be increased, but which incurs a loss of light passing therethrough.

Figure 3:
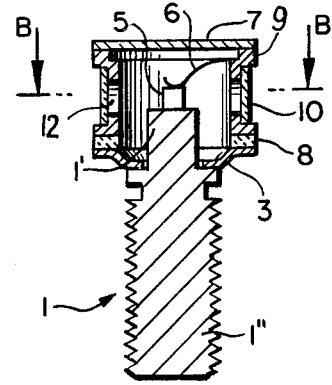
FIG. 3 is a cross-sectional view of one embodiment of the electricity-to-light converting semiconductor device according to the present invention.
Figure 4:
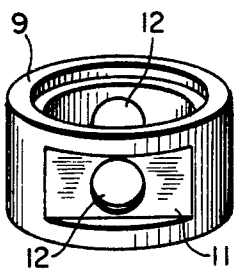
FIG. 4 is a perspective view illustrative of a metallic cylinder for use in the semiconductor device according to the present invention.
Figure 5:
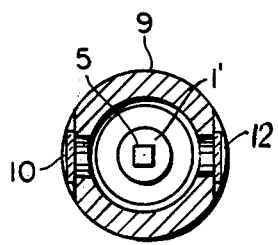
FIG. 5 is a cross-sectional view taken along the line B—B of FIG. 3.

Now, referring to FIGS. 3 to 5, a laser diode device according to an embodiment of the invention comprises a stud 1 made of copper having a body portion 1″, 4 mm in diameter and 10 mm in height, and a projected portion 1′, 3 mm in diameter and 2 mm in height, with a flat top surface. An insulating member 8 made of alumina ceramic, 7 mm in inner diameter, 12 mm in outer diameter and 1 mm in thickness, is hermetically secured to the stud 1 through a supporting member 3 made of Kovar, 12 mm in outer diameter, 9 mm in inner diameter and 0.3 mm in thickness. The insulating ring 8 of alumina ceramics affords a sufficient mechanical strength and a good thermal conductivity. Mechanical connections of the insulating member 8 with the supporting member 3 and of the supporting member 3 with the stud 1 are done by metal fusion and provides strong sealings. The Kovar supporting member 3 serves to reduce thermal strain produced between the insulating member 8 and the stud 1. Kovar is a trade-mark for an alloy containing approximately 29% nickel, 17% cobalt and 0.3% manganese, the balance being essentially iron. Copper cylinder 9, 12 mm in outer diameter, 7 mm in inner diameter and 6 mm in thickness, is hermetically connected to the upper surface of the insulating member 8 by metal fusion. As shown in FIG. 4, the copper cylinder 9 has two flat portions 11, 6 mm in width and 4 mm in height on its outer periphery. Each of the flat portions 11 is provided with the opening 12, 2 mm in diameter on its central portion which can afford to permit passing of light beam therethrough. A flat glass plate 10, 6 mm in width, 4 mm in height and 0.2 mm in thickness, made of Kovar glass with both surfaces optically polished is attached to each flat portion 11 of the copper cylinder 9 in a manner to cover the opening 12 by using a low-melting-point glass. A semiconductor laser element 5 is mounted on the flat top surface of the projected portion 1′ of the stud 1 in such manner that one electrode near the active layer of the laser element 5 is bonded to the projected portion 1′ of the stud 1 by using tin solder, whereby the stud 1 forms a first lead-out electrode of the device. The electrode on the upper surface of the laser element 5 is connected to the Kovar cylinder 9 by a fine gold wire 6. Then disc-shaped copper cap 7, 12 mm in diameter and 0.3 mm in thickness, is hermetically secured to the upper end of the copper cylinder 9 by welding. The cylinder 9 or the cap 7 forms another lead-out electrode of the device. When the stud 1 is positively biased with the copper cover 7 negatively biased and a current of a value above a threshold level is then supplied across the laser element 5, laser beams are generated from the element 5 in the opposite two directions and emitted through the glass plates 10 at the openings 12 to the outside.

As is apparent from FIGS. 3 and 5, the flat glass plates 10, through which light beams are transmitted, are not affected by a force applied to the device for the purposes of mounting, electrical connection and the like, so that the thickness of the flat glass plate 10 may be reduced to a considerable extent. Moreover, the glass plate 10 can be finished to high-precision parallelism and flatness, because it is formed as a single independent part. As a result, there can be obtained a laser diode which presents high mechanical strength and permits the efficient transmission of light beam to the exterior, being free of divergence of beam.

In addition, in this structure, the semiconductor element 5 disposed on the projected portion of the copper stud 1 can be gained excellent thermal radiation. If necessary, the projected portion 1′ of the stud 1 may be replaced by a heat sink made of another material.

Figure 6:
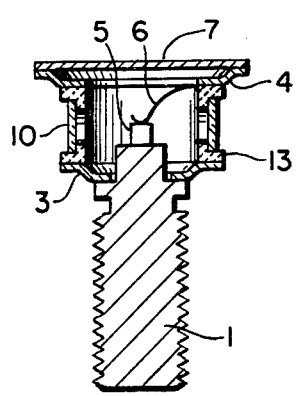
FIG. 6 is a cross-sectional view of another embodiment of the invention.

Referring to FIG. 6, another embodiment of the invention employs, in place of the copper cylinder 9 of the preceding embodiment, an insulating cylinder 13, 10 mm in outer diameter, 7 mm in inner diameter, 6 mm in height and 1.5 mm in thickness, made of alumina ceramic so as to provide a function of the insulating cylinder 8 in the preceding embodiment.

This ceramic cylinder 13 has the same shape as the copper cylinder 9 shown in FIG. 4 and is provided with glass plates 10 same as in the preceding embodiment. The bottom end of this cylinder 13 is directly connected to the supporting member 3; copper cover 7, 12 mm in diameter and 0.3 mm in thickness is hermetically attached to the upper end of the ceramic cylinder 13 by way of a Covar ring 4, 12 mm in outer diameter, 7 mm in inner diameter and 0.25 mm in thickness, for reducing thermal strain between the copper cover 7 and the cylindrical body 13. It is needless to mention that this embodiment also provides advantages equivalent to those given by the preceding embodiment of the invention. As is apparent from the foregoing description of the laser diode device, in which there are provided openings in the wall of a cylindrical member, with a thin, transparent, flat plate being attached thereto in a manner to cover the aforesaid openings, there may be achieved a laser diode device which may present desired transmissive characteristic of light. It will be apparent that the present invention may be applied to other optical semiconductor devices including light-emitting diodes and light-receiving diodes with satisfactory results. Moreover, three or more openings each covered with a thin, transparent plate may be formed on the side wall of the cylinder member.

What is claimed is:

1. A hermetically sealed opto-electrical semiconductor device comprising:
   a cylindrical envelope made of metal having first and second ends and a side surface, said side surface having at least two openings disposed to permit the passage of light beams, and at least two grooves, the bottom portions of said grooves comprising flat portions disposed respectively about the periphery of each of said openings;
   thin, flat plates of a transparent material having a thickness smaller than the depth of said grooves, each of said plates having one major face attached respectively to one of said flat portions of said grooves so that such plate covers one of said openings to hermetically seal said opening, said plates being placed over said openings in a direction perpendicular to the path of said light beams;
   a disk shaped metal cap electrically and hermetically attached to the first end of said envelope;
   an insulating ring attached to said second end of said envelope;

a metal ring hermetically sealed to said insulating ring;

a metal body hermetically sealed to said metal ring, said metal body having a first end portion extending through said metal ring into the interior of said envelope and a second end portion disposed outside said envelope and having a threaded exterior surface;

an opto-electrical semiconductor element having a first and second electrode surfaces, said first electrode surface being electrically connected to said first end portion of said metal body; and means for electrically coupling said second electrode surface of said element to said envelope.

2. A semiconductor device as claimed in claim 1 in which the material of said metal ring has a coefficient of thermal expansion close to that of said insulating ring.

3. A semiconductor device as claimed in claim 2 in which said metal ring is made of Kovar and said insulating ring is made of an alumina ceramic.

4. A hermetically sealed opto-electrical semiconductor device comprising:

a cylindrical envelope made of ceramic material having first and second ends and a side surface, said side surface having at least two openings disposed to permit the passage of light beams, and at least two grooves, the bottom portions of said grooves comprising flat portions disposed respectively about the periphery of each of said openings, the outer edges of said flat portions forming rectangular outlines;

thin, flat plates of a transparent material, each of said plates having one major face attached respectively to one of said flat portions of said envelope so that such plate covers one of said openings to hermetically seal said opening, said plates being placed over said openings in a direction perpendicular to the path of said light beams;

first and second metal rings hermetically sealed respectively to said first and second ends of said envelope;

a disk shaped metal cap electrically and hermetically attached to said first metal ring;

a metal body hermetically sealed to said second metal ring, said metal body having a first end portion extending through said second metal ring into the interior of said envelope and a second end portion disposed outside said envelope and having a threaded exterior surface;

an opto-electrical semiconductor element having a first and second electrode surface, said first electrode surface being electrically connected to said first end portion of said metal body; and means for electrically coupling said second electrode surface of said element to said envelope.

5. A semiconductor device as claimed in claim 4 in which the material of said metal rings has a coefficient of thermal expansion close to that of said ceramic envelope.

6. A semiconductor device as claimed in claim 5 in which said metal rings are made of Kovar and said ceramic envelope is made of an alumina ceramic.

7. A hermetically sealed opto-electrical semiconductor device comprising:

a cylindrical envelope having first and second ends and a side surface, said side surface having two opposed openings to permit the passage of light beams and having two grooves of predetermined depth, the bottom portions of said grooves defining rectangular planar surfaces disposed symmetrically about each of said openings;

two thin, planar plates of a transparent material, each of said plates having one major surface attached respectively to one of said rectangular planar surfaces on said envelope, said plates having a thickness less than said predetermined depth, and being placed over said openings in a direction perpendicular to the path of said light beams;

first and second metallic closure members connected respectively to each end of said cylindrical envelope to hermetically seal said envelope;

insulating means to electrically insulate said metallic closure members from each other; and an opto-electrical semiconductor element electrically connected to each of said closure members.

8. A semiconductor device as claimed in claim 7 in which said cylindrical envelope is metallic;

said first closure means is a metallic disk hermetically sealed to said first end of said envelope;

said insulating means is a ring of an electrically insulating material connected to said second end of said envelope; and said second closure means includes a ring-like metallic member connected to said ring of insulating material.

9. A semiconductor device as claimed in claim 8 in which the material of said ring-like metallic member has a coefficient of thermal expansion close to that of said ring of insulating material.

10. A semiconductor device as claimed in claim 9 in which said ring-like metallic member is made of Kovar and said ring of insulating material is made of an alumina ceramic.

11. A semiconductor device as claimed in claim 7 in which said cylindrical envelope is made of a ceramic material and constitutes said insulating means and in which each of said metallic closure members include ring-like metallic members connected to said ceramic envelope.

12. A semiconductor device as claimed in claim 11 in which the material of said ring-like metallic members has a coefficient of thermal expansion close to that of said ceramic envelope.

13. A semiconductor device as claimed in claim 12 in which said ring-like metallic members are made of Kovar and said ceramic envelope is made of an alumina ceramic.

* * * * *

UNITED STATES PATENT OFFICE
CERTIFICATE OF CORRECTION

Patent No. 4,131,911　　　　　　　Dated DECEMBER 26, 1978

Inventor(s) Nobuhiko Fujine and Masato Nakajima

It is certified that error appears in the above-identified patent and that said Letters Patent are hereby corrected as shown below:

The Assignee's name should read as follows:

Nippon Electric Co., Ltd.

Signed and Sealed this

Tenth Day of April 1979

[SEAL]

Attest:

RUTH C. MASON
*Attesting Officer*

DONALD W. BANNER
*Commissioner of Patents and Trademarks*